(12) United States Patent
Kronholz et al.

(10) Patent No.: US 8,071,442 B2
(45) Date of Patent: Dec. 6, 2011

(54) TRANSISTOR WITH EMBEDDED SI/GE MATERIAL HAVING REDUCED OFFSET TO THE CHANNEL REGION

(75) Inventors: Stephan Kronholz, Dresden (DE); Markus Lenski, Dresden (DE); Andy Wei, Dresden (DE); Andreas Ott, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 12/552,642

(22) Filed: Sep. 2, 2009

(65) Prior Publication Data
US 2010/0078689 A1 Apr. 1, 2010

(30) Foreign Application Priority Data
Sep. 30, 2008 (DE) .......................... 10 2008 049 733

(51) Int. Cl.
*H01L 21/8242* (2006.01)
(52) U.S. Cl. ........ 438/256; 438/300; 438/301; 438/429; 438/430; 438/700; 438/702; 438/703; 438/689; 438/42; 438/43; 257/19; 257/622; 257/E21.092; 257/E21.102; 257/E21.115; 257/E21.127; 257/E21.131; 257/E21.132; 257/E21.218; 257/E21.385; 257/E21.431
(58) Field of Classification Search .................... 257/19, 257/622, E21.092, E21.102, E21.115, E21.127, 257/E21.131, E21.132, E21.218, E21.219, 257/E21.223, E21.284, E21.385, E21.42, 257/E21.431; 438/42, 44, 689, 700, 702, 438/703, 256, 300, 301, 429, 430
See application file for complete search history.

(56) References Cited

U.S. PATENT DOCUMENTS

| | | | |
|---|---|---|---|
| 5,620,912 A * | 4/1997 | Hwang et al. | 438/301 |
| 6,071,783 A * | 6/2000 | Liang et al. | 438/301 |
| 7,078,285 B1 | 7/2006 | Suenaga | 438/199 |
| 7,154,146 B2 * | 12/2006 | Wang et al. | 257/344 |
| 7,422,950 B2 | 9/2008 | Curello et al. | 438/300 |
| 7,525,160 B2 | 4/2009 | Kavalieros et al. | 257/369 |
| 7,544,576 B2 * | 6/2009 | Jawarani et al. | 438/300 |

(Continued)

FOREIGN PATENT DOCUMENTS

EP   1 677 360 A2   7/2006

(Continued)

OTHER PUBLICATIONS

Translation of Official Communication from German Patent Office for German Patent Application No. 10 2008 049 733.9-33 dated May 6, 2009.

(Continued)

*Primary Examiner* — Lynne Gurley
*Assistant Examiner* — Meiya Li
(74) *Attorney, Agent, or Firm* — Williams, Morgan & Amerson, P.C.

(57) ABSTRACT

A strain-inducing semiconductor alloy may be formed on the basis of cavities which may have a non-rectangular shape, which may be maintained even during corresponding high temperature treatments by providing an appropriate protection layer, such as a silicon dioxide material. Consequently, a lateral offset of the strain-inducing semiconductor material may be reduced, while nevertheless providing a sufficient thickness of corresponding offset spacers during the cavity etch process, thereby preserving gate electrode integrity. For instance, P-channel transistors may have a silicon/germanium alloy with a hexagonal shape, thereby significantly enhancing the overall strain transfer efficiency.

17 Claims, 7 Drawing Sheets

U.S. PATENT DOCUMENTS

| | | | |
|---|---|---|---|
| 2005/0148147 A1* | 7/2005 | Keating et al. | 438/299 |
| 2006/0076619 A1* | 4/2006 | Wang et al. | 257/336 |
| 2006/0115949 A1 | 6/2006 | Zhang et al. | 438/300 |
| 2006/0202234 A1 | 9/2006 | Hara | 257/213 |
| 2007/0026593 A1* | 2/2007 | Jawarani et al. | 438/197 |
| 2007/0164364 A1* | 7/2007 | Kawasaki | 257/368 |
| 2008/0003783 A1 | 1/2008 | Wei et al. | 438/478 |
| 2008/0220579 A1* | 9/2008 | Pal et al. | 438/265 |
| 2009/0166618 A1* | 7/2009 | Mowry et al. | 257/48 |
| 2009/0261349 A1* | 10/2009 | Lee et al. | 257/77 |
| 2009/0289379 A1* | 11/2009 | Han et al. | 257/E21.431 |

FOREIGN PATENT DOCUMENTS

| | | |
|---|---|---|
| WO | WO 2007/124415 A2 | 11/2007 |
| WO | WO 2008/121855 A1 | 10/2008 |

OTHER PUBLICATIONS

PCT International Search Report from PCT/EP2009/007002 dated Jan. 22, 2010.
PCT International Preliminary Report on Patentability from PCT/EP2009/007002 dated Apr. 14, 2011.

\* cited by examiner

TRANSISTOR WITH EMBEDDED SI/GE MATERIAL HAVING REDUCED OFFSET TO THE CHANNEL REGION

BACKGROUND OF THE INVENTION

1. Field of the Invention

Generally, the present disclosure relates to the fabrication of integrated circuits, and, more particularly, to transistors having strained channel regions by using embedded semiconductor alloys, such as silicon/germanium, to enhance charge carrier mobility in the channel regions of the transistors.

2. Description of the Related Art

The fabrication of complex integrated circuits requires the provision of a large number of transistor elements, which represent the dominant circuit element for complex circuits. For example, several hundred millions of transistors may be provided in presently available complex integrated circuits. Generally, a plurality of process technologies are currently practiced, wherein, for complex circuitry, such as microprocessors, storage chips and the like, CMOS technology is currently the most promising approach due to the superior characteristics in view of operating speed and/or power consumption and/or cost efficiency. In CMOS circuits, complementary transistors, i.e., P-channel transistors and N-channel transistors, are used for forming circuit elements, such as inverters and other logic gates to design highly complex circuit assemblies, such as CPUs, storage chips and the like. During the fabrication of complex integrated circuits using CMOS technology, transistors, i.e., N-channel transistors and P-channel transistors, are formed on a substrate including a crystalline semiconductor layer. A MOS transistor, or generally a field effect transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed in the vicinity of the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Thus, the reduction of the channel length, and associated therewith the reduction of the channel resistivity, is a dominant design criterion for accomplishing an increase in the operating speed of the integrated circuits.

The continuing shrinkage of the transistor dimensions, however, involves a plurality of issues associated therewith that have to be addressed so as to not unduly offset the advantages obtained by steadily decreasing the channel length of MOS transistors. For example, highly sophisticated dopant profiles, in the vertical direction as well as in the lateral direction, are required in the drain and source regions to provide low sheet and contact resistivity in combination with a desired channel controllability. Moreover, the gate dielectric material may also be adapted to the reduced channel length in order to maintain the required channel controllability. However, some mechanisms for maintaining a high channel controllability may also have a negative influence on the charge carrier mobility in the channel region of the transistor, thereby partially offsetting the advantages gained by the reduction of the channel length.

Since the continuous size reduction of the critical dimensions, i.e., the gate length of the transistors, necessitates the adaptation and possibly the new development of highly complex process techniques and may also contribute to less pronounced performance gain due to mobility degradation, it has been proposed to enhance the channel conductivity of the transistor elements by increasing the charge carrier mobility in the channel region for a given channel length, thereby enabling a performance improvement that is comparable with the advance to a technology standard requiring extremely scaled critical dimensions, while avoiding or at least postponing many of the process adaptations associated with device scaling.

One efficient mechanism for increasing the charge carrier mobility is the modification of the lattice structure in the channel region, for instance by creating tensile or compressive stress in the vicinity of the channel region to produce a corresponding strain in the channel region, which results in a modified mobility for electrons and holes, respectively. For example, creating tensile strain in the channel region for a standard crystallographic configuration of the active silicon material, i.e., a (100) surface orientation with the channel length aligned to the <110> direction, increases the mobility of electrons, which in turn may directly translate into a corresponding increase in conductivity. On the other hand, compressive strain in the channel region may increase the mobility of holes, thereby providing the potential for enhancing the performance of P-type transistors. The introduction of stress or strain engineering into integrated circuit fabrication is an extremely promising approach, since strained silicon may be considered as a "new" type of semiconductor material, which may enable the fabrication of fast powerful semiconductor devices without requiring expensive semiconductor materials, while many of the well-established manufacturing techniques may still be used.

Consequently, it has been proposed to introduce, for instance, a silicon/germanium (Si/Ge) material next to the channel region to induce a compressive stress that may result in a corresponding strain. When forming the silicon/germanium material, the drain and source regions of the PMOS transistors are selectively recessed to form cavities, while the NMOS transistors are masked, and subsequently the silicon/germanium material is selectively formed in the cavities of the PMOS transistor by epitaxial growth.

Although this technique provides significant advantages in view of performance gain of P-channel transistors and thus of the entire CMOS device, it turns out, however, that a further increase of the strain component in the channel region may be difficult to achieve by reducing the lateral offset of the silicon/germanium alloy with respect to the channel region without compromising integrity of the gate electrode structure, as will now be described in more detail with reference to FIGS. 1a-1e to more clearly demonstrate one conventional approach for forming a silicon/germanium alloy.

Figure 1A:
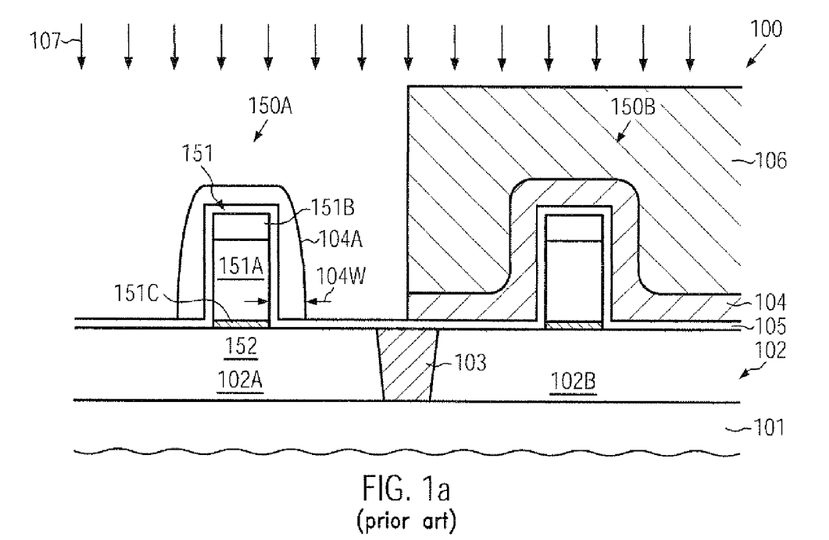
FIGS. 1a-1e schematically illustrate cross-sectional views of a conventional semiconductor device during various manufacturing stages in forming a silicon/germanium alloy in a P-channel transistor, according to conventional strategies.

FIG. 1a schematically illustrates a cross-sectional view of a conventional semiconductor device 100 at an early manufacturing stage. As illustrated, the semiconductor device 100 comprises a substrate 101, such as a silicon substrate, above which may be formed a buried insulating layer (not shown) if a silicon-on-insulator (SOI) configuration is considered. Furthermore, a silicon-based semiconductor layer 102 is formed above the substrate 101 and represents an "active" semiconductor material for forming therein and thereon circuit elements, such as transistors and the like. As illustrated, the semiconductor layer 102 comprises a first active region 102A and a second active region 102B, which are separated by an isolation structure 103, such as a shallow trench isolation and the like. The active region 102A represents an appropriately doped semiconductor material for forming therein and thereabove a P-channel transistor 150A, while the active region 102B may have an appropriate dopant concentration to provide the basic characteristics for an N-channel transistor 150B. In the manufacturing stage shown, the transistors 150A, 150B comprise a gate electrode structure 151, which may include a gate electrode material 151A, a cap layer 151B formed on a top surface of the gate electrode material 151A and a gate insulation layer 151C, which separates the gate electrode material 151A from a channel region 152 of the corresponding active regions 102A, 102B. Furthermore, a spacer element 104A is formed on sidewalls of the gate electrode structure 151 of the P-channel transistor 150A, possibly in combination with an etch stop liner 105. On the other hand, the N-channel transistor 150B is covered by a spacer layer 104, possibly in combination with the etch stop liner 105.

The semiconductor device 100 may be formed according to the following process techniques in compliance with well-established conventional approaches for providing a silicon/germanium alloy. After defining the active regions 102A, 102B by forming the isolation structure 103 and performing appropriate implantation sequences in order to establish the basic dopant concentration, the gate electrode structures 151 may be formed by providing an appropriate material for the gate insulation layers 151C followed by the deposition of a gate electrode material. Furthermore, material of the cap layers 151B may also be deposited. For this purpose, well-established oxidation, surface treatments and deposition techniques may be used, depending on the required materials and characteristics thereof. For example, the material for the gate insulation layer 151C may be formed by oxidation and/or deposition or surface treatment, for instance for forming silicon dioxide-based materials having a thickness of approximately one to several nanometers in sophisticated semiconductor devices. In other cases, high-k dielectric materials may be used, such as hafnium oxide and the like, which may typically have a dielectric constant of 10 or higher, thereby increasing the capacitive coupling of the gate electrode material 151A to the channel region 152 for a given physical thickness of the gate dielectric material. Thereafter, any appropriate material for the gate electrode 151A may be provided, for instance in the form of polysilicon and the like, followed by the deposition of the cap material 151B, which may be provided in the form of a silicon nitride material and the like. During the subsequent patterning of these material layers, sophisticated lithography techniques and etch processes may be used in order to obtain the gate electrode structure 151 with a desired gate length according to the design rules for the device 100. Next, the etch stop liner 105 may be formed by deposition and/or oxidation, followed by the deposition of the spacer layer 104, typically provided in the form of a silicon nitride material, which may be deposited by thermally activated chemical vapor deposition (CVD) recipes, plasma assisted processes and the like. When depositing the spacer layer 104, a thickness thereof may be selected in view of a desired width 104W of the spacer element 104A, which in turn may determine an offset of the silicon/germanium alloy to be formed in the active region 102A in a later manufacturing stage. In sophisticated applications, the width 104W is desirably reduced in order to enhance the strain-inducing mechanism obtained by the silicon/germanium material. However, although a reduced thickness of the spacer layer 104 may be desirable in view of a performance gain of the transistor 150A, preferred value for the thickness of the spacer layer 104 may have to be provided in view of maintaining overall integrity of the gate electrode material 151A and of the gate insulation layer 151C during the further processing in providing the strained silicon/germanium alloy. Consequently, typically, a thickness of 10-30 nm may be selected, thereby providing a required process margin in view of the subsequent manufacturing processes. After forming the spacer layer 104, an etch mask 106 is provided on the basis of photolithography techniques in order to cover the transistor 150B and the corresponding portion of the spacer layer 104, while exposing the transistor 150A to an etch ambient 107 that is designed to selectively remove material of the spacer layer 104, thereby forming the spacer element 104A. The etch process 107 may be performed on the basis of well-established plasma assisted anisotropic etch techniques, wherein, if required, control of the etch process may be accomplished on the basis of the etch stop liner 105. Thereafter, the liner 105 may be removed and a further etch process or a further step of the process 107 may be performed on the basis of appropriately selected etch parameters and etch chemistry for etching into the active region 102A selectively to the spacer 104A and the isolation structure 103. For example, highly selective anisotropic etch techniques for removing silicon selectively to oxide and nitride are well established in the art.

Figure 1B:
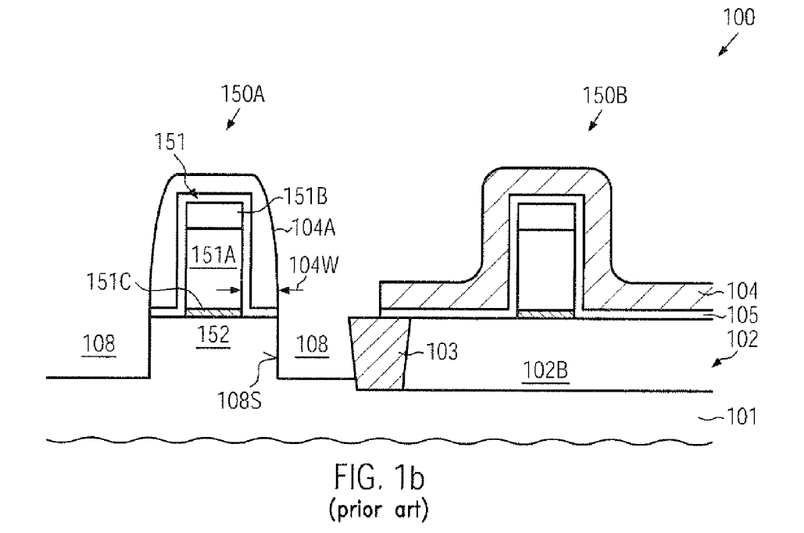

FIG. 1b schematically illustrates the semiconductor device 100 in a further advanced manufacturing stage. As illustrated, corresponding cavities 108 are formed adjacent to the gate electrode structure 151 and the spacer element 104A, wherein, due to the anisotropic nature of the preceding plasma assisted etch process, substantially vertical sidewalls 108S are obtained so that a lateral offset of the cavities 108 and thus of any silicon/germanium alloy still to be formed in a later manufacturing stage with respect to the gate electrode material 151A is substantially determined by the width 104W of the spacer 104A, possibly in combination with the thickness of the etch stop liner 105, if provided. After the corresponding cavity etch process or prior to the process, the etch mask 106 may be removed.

Figure 1C:
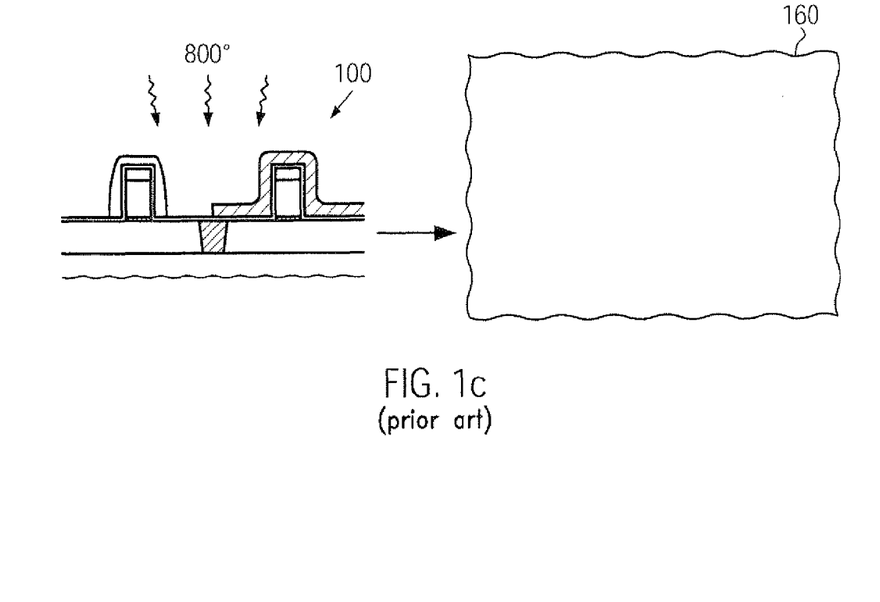

FIG. 1c schematically illustrates the semiconductor device 100 in a subsequent manufacturing stage in which the device 100 may be heated to an elevated temperature, for instance, 800° C. and higher in order to prepare the device 100 for being loaded into a corresponding process chamber or process ambient 160 that is appropriate for performing a selective epitaxial growth process.

Figure 1D:
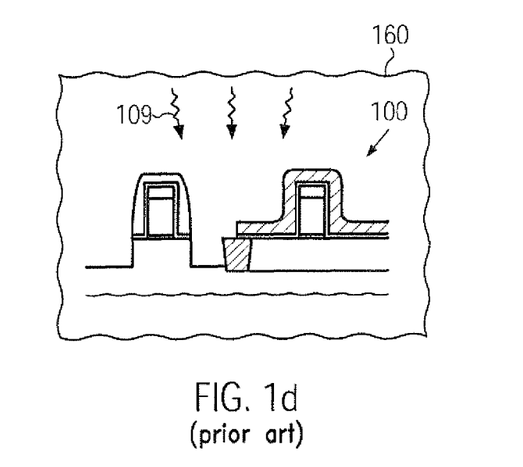

FIG. 1d schematically illustrates the semiconductor device 100 during a heat treatment 109 that is performed in the process ambient 160, which may be performed at a temperature of, for example, 850° C. and higher to remove any native oxide, which may have formed on exposed surface areas of the cavities 108 (FIG. 1b). During the elevated temperatures of approximately 800° C. and higher, a certain degree of silicon reflow may occur and may thus "blur" the initial shape of the cavities 108. After the heat treatment 109, the temperature within the process ambient 160 may be adjusted to the desired deposition temperature, which may be approximately 750° C. and less, depending on the overall process parameters, such as pressure, precursor gas flow rates, rates for precursors for dopant species and the like.

Figure 1E:
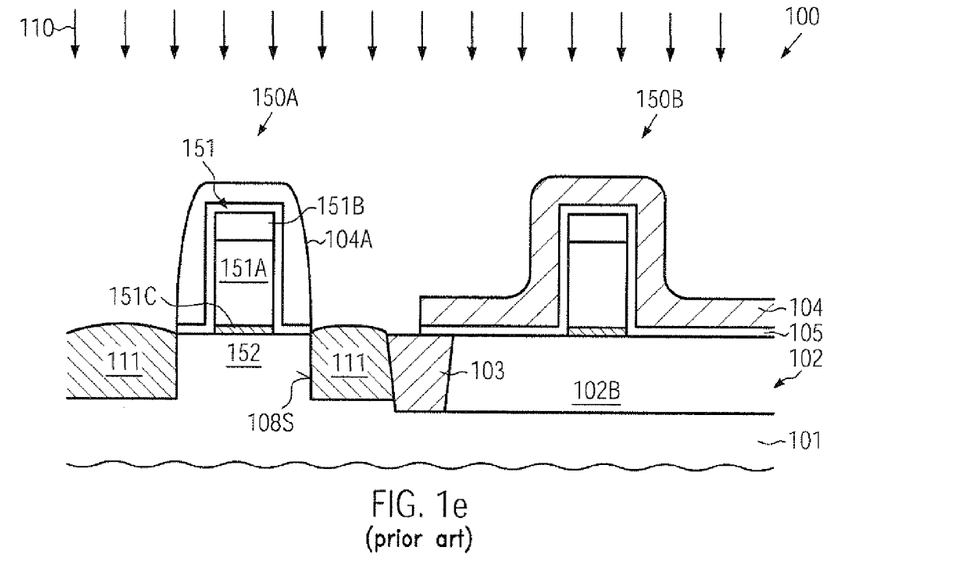

FIG. 1e schematically illustrates the device 100 during a corresponding selective epitaxial growth process 110, during which a silicon/germanium alloy 111 may be formed in the cavities 108, wherein a lateral offset of the material 111 with respect to gate electrode material 151A is substantially defined by the width 104W (FIG. 1b), as previously explained. Consequently, by using a predefined fraction of germanium species in the material 111, a corresponding high degree of internal strain may be created wherein, however, the actual strain in the channel region 152 may be significantly affected by lateral offset of the material 111.

A further reduction of the spacer width 104W may be associated with a high risk for creating defects in the gate electrode structure 151 so that respective approaches may be less than desirable in view of overall production yield and product reliability.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and techniques in which an increased degree of flexibility may be obtained with respect to shaping respective cavities to be formed adjacent to a gate electrode structure and also to maintain a desired shape of the cavities prior to the actual selective epitaxial growth process. In some illustrative aspects disclosed herein, the cavities may be formed so as to extend below a corresponding spacer structure, thereby achieving a reduced lateral offset with respect to the channel region, wherein a corresponding appropriate shape of the under-etched area may be maintained throughout the entire process sequence for forming the strained semiconductor alloy. To this end, a protection layer may be provided on exposed surface areas of the cavities prior to exposing the device to elevated temperatures, thereby substantially preventing reflow of the silicon material. Consequently, a corresponding advantageous shape of the cavity may be maintained, for instance a "hexagonal" shape that may be obtained on the basis of a crystallographically anisotropic etch procedure, which may thus provide an enhanced overall strain transfer mechanism, while nevertheless integrity of the gate electrode structure may be maintained due to an appropriately selected thickness of a corresponding offset spacer structure.

One illustrative method disclosed herein comprises forming cavities in a silicon-containing crystalline semiconductor region adjacent to a gate electrode structure of a transistor of a semiconductor device, wherein the gate electrode structure comprises an offset spacer formed on sidewalls thereof. The method further comprises forming a protection layer on exposed surfaces of the cavities and introducing the semiconductor device into a process ambient at an elevated first temperature. The method further comprises adjusting the process ambient so as to have a second lower temperature and removing the protection layer in the process ambient at the second lower temperature. Finally, a semiconductor alloy is formed in the cavities in the process ambient at the second temperature.

A further illustrative method disclosed herein comprises forming cavities in a crystalline semiconductor region adjacent to a gate electrode structure of a transistor by performing a first etch process on the basis of a plasma ambient and a second etch process on the basis of a wet etch chemistry. The method further comprise forming a strain-inducing semiconductor alloy in the cavities and forming drain and source regions in the semiconductor region and at least partially in the strain-inducing semiconductor alloy.

One illustrative semiconductor device disclosed herein comprises a transistor that is formed above a substrate. The transistor comprises a gate electrode structure formed above a crystalline semiconductor region and a strain-inducing semiconductor alloy formed in the crystalline semiconductor region at a drain side and a source side of the transistor. Moreover, the strain-inducing semiconductor alloy forms at each of the drain side and the source side a first inclined interface and a second inclined interface with the crystalline semiconductor region, wherein the first and second inclined interfaces are connected to each other so as to form an edge. Furthermore, the transistor comprises drain and source regions formed in the crystalline semiconductor region and at least partially in the semiconductor alloy.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides semiconductor devices and techniques for forming the same, wherein the strain-inducing mechanism of a semiconductor alloy formed in a drain side and a source side of a transistor in the active region may be increased, while nevertheless maintaining a desired width of corresponding offset spacers, in that an increased flexibility for designing the overall shape of the cavities may be provided. To this end, in one illustrative aspect disclosed herein, stability of the cavities formed in the silicon-containing base material may be increased during elevated temperatures, for instance during the loading procedure into a corresponding deposition chamber for performing a selective epitaxial growth process by forming an appropriate protection layer, such as an oxide layer, a nitride layer and the like, which may be removed within a process ambient at a reduced non-critical temperature prior to actually depositing the strain-inducing semiconductor alloy at the non-critical temperature. Consequently, according to this approach, the cavities may be formed so as to have any desired shape, for instance an under-etched region may be produced during the corresponding etch sequence, thereby enabling the provision of the offset spacer elements with a required thickness to maintain gate electrode integrity, while nevertheless reducing the lateral offset of the strain-inducing semiconductor alloy. Due to the protection layer, the corresponding initial shape of the cavity may be substantially maintained throughout the entire process sequence for forming the semiconductor alloy, which may thus provide enhanced strain for a given composition of the semiconductor alloy.

In other illustrative aspects, the process for forming cavities may be based on a plasma assisted etch process followed by a wet chemical etch process, which may provide a reduced lateral offset of the cavities with respect to the channel region, wherein, in some illustrative embodiments, the wet chemical etch process may be performed as a crystallographically anisotropic etch process, thereby obtaining a well-defined shape of the cavity. For example, a wet etch chemistry may be used that provides a reduced removal rate with respect to the (111) crystal orientation, which may thus "convert" the substantially rectangular cavities obtained from the preceding anisotropic plasma assisted etch process into "hexagonal" or diamond-shaped cavities having inclined interfaces with the adjacent semiconductor region, as is determined by the crystallographic configuration of the basic semiconductor material. In some illustrative embodiments, the cavities may be provided with an appropriate protection layer so that the corresponding initial non-rectangular shape of the cavities may be maintained even during high temperature treatments, thereby also providing enhanced flexibility when selecting an appropriate process strategy for forming the strain-inducing semiconductor alloy within the non-rectangular cavities. Based on this well-defined cavity shape, a significant increase of the strain component may be obtained in the adjacent channel region for a given composition of the strain-inducing alloy, such as a silicon/germanium alloy, a silicon/germanium/tin alloy, a silicon/tin alloy or a silicon/carbon alloy when corresponding tensile strain components may be required.

With reference to FIGS. 2a-2g, further illustrative embodiments will now be described in more detail, wherein reference may also be made to FIGS. 1a-1e when appropriate.

Figure 2A:
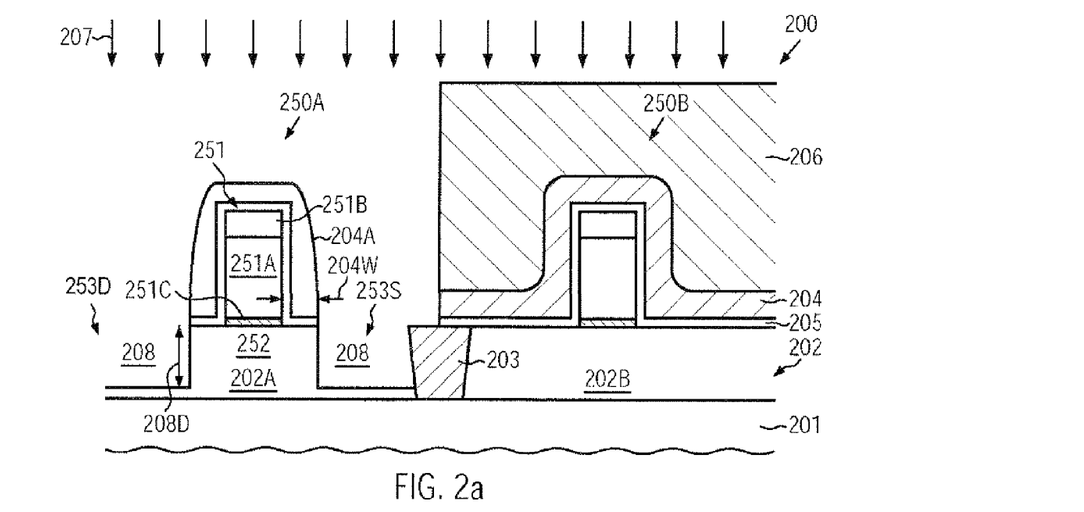
FIGS. 2a-2b schematically illustrate cross-sectional views of a semiconductor device during various manufacturing stages in forming non-rectangular cavities in an active region adjacent to a gate electrode structure comprising an appropriately sized offset spacer element, according to illustrative embodiments.

FIG. 2a schematically illustrates a cross-sectional view of a semiconductor device 200 comprising a substrate 201, above which may be formed a semiconductor layer 202. Furthermore, as also previously discussed with reference to the device 100, at least locally a buried insulating layer (not shown) may be positioned between the substrate 201 and the silicon-containing semiconductor layer 202, if an SOI configuration is required, at least in some device regions of the device 200. Moreover, corresponding active regions 202A, 202B for transistors 250A, 250B may be formed in the semiconductor layer 202 and may be separated by an isolation structure 203. Furthermore, transistors 250A, 250B may comprise a gate electrode structure 251, for instance comprising a gate electrode material 251A, a cap layer 251B and a gate insulation layer 251C. Additionally, on sidewalls of the gate electrode 251 of the transistor 250A, a spacer structure 204A, possibly in combination with an etch stop liner, may be formed. On the other hand, the transistor 250B may be covered by a spacer layer 204, possibly in combination with an etch stop liner 205. It should be appreciated that, for the components described so far, the same criteria may apply as previously explained with reference to the corresponding components of the semiconductor device 100. For example, a width 204W of the spacer 204A may be selected so as to maintain integrity of the gate electrode structure 251, as previously explained, while a corresponding offset of a semiconductor alloy to be formed at a drain side 253D and a source side 253S may be less critical since the shape of the cavities 208 may be varied according to illustrative embodiments in a later manufacturing stage. Moreover, in the manufacturing stage shown in FIG. 2a, an etch mask 206, such as a resist mask, a hard mask material and the like, may be formed above the transistor 250B, while exposing the transistor 250A to an etch ambient 207, which may be established on the basis of a plasma ambient in order to obtain a substantially anisotropic etch behavior, as is also previously discussed with reference to the semiconductor device 100.

The semiconductor device 200 as shown in FIG. 2a may be formed on the basis of similar process techniques as also described above with reference to the device 100, wherein, however, a depth 208D of the cavities 208 may be selected to enable performing a further etch process to appropriately adjust the final shape of the cavities 208. For example, if a corresponding reduction of a lateral offset of the cavities 208 with respect to the gate electrode material 251A is desired, the initial depth 208D may be adjusted such that a comparable material removal in the depth direction may still provide sufficient template material of the basic active region 202A. In other illustrative embodiments, prior to the etch process 207 or after the process 207, an appropriate etch control species (not shown) may be introduced into the active region 202A and may be positioned at a desired height level in order to define an appropriate depth of the cavities 208 during and after a corresponding additional etch process. For instance, prior to forming the gate electrode structure 251 or after patterning the same, an N-type dopant species may be positioned at an appropriate depth, which may act as an etch stop material in a corresponding wet chemical etch process, as will be described later on with reference to FIG. 2b. In this case, the initial depth 208D may substantially correspond to the finally desired depth of corresponding cavities.

Figure 2B:
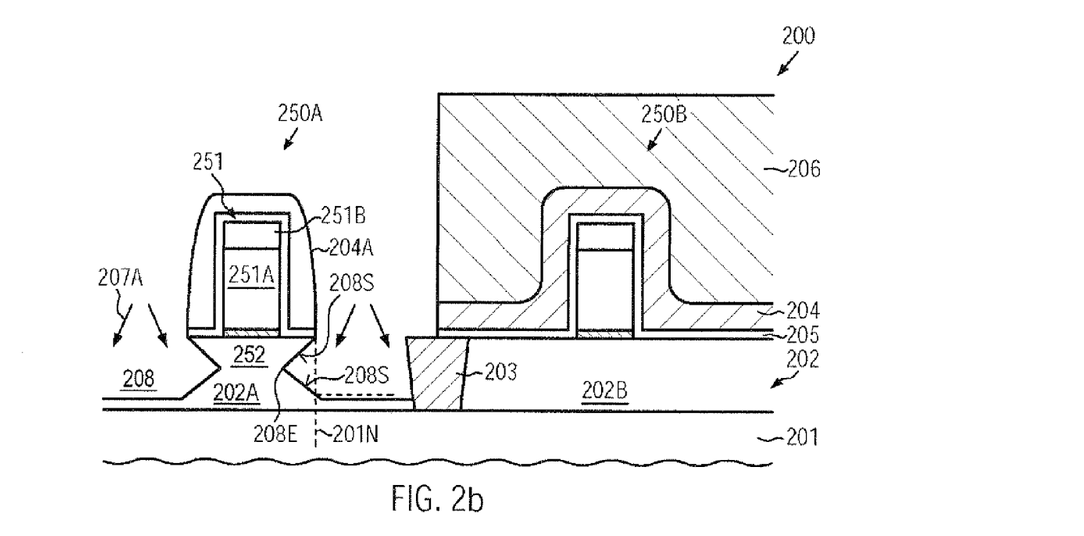

FIG. 2b schematically illustrates the semiconductor device 200 in an advanced manufacturing stage in which the device 200 is exposed to a further etch ambient 207A, which may provide a lateral removal rate in order to at least locally reduce a lateral offset of the cavities 208 with respect to the gate electrode material 251A. For instance, in some embodiments, the etch process 207A may be performed on the basis of a plasma which provides a substantially isotropic etch behavior, thereby increasing the initial depth 208D (FIG. 2a), while also forming an under-etched area so that the cavity 208 may extend under the spacer structure 204A. In the embodiment shown in FIG. 2b, the etch process 207A may be performed as a wet chemical etch process, thereby also obtaining a lateral removal rate as may be required for reducing the offset of the cavities 208. In one illustrative embodiment, as illustrated, the wet chemical etch process 207A may additionally provide a crystallographically anisotropic etch behavior, which is to be understood as describing an etch behavior in which the removal rate in at least one crystallographic orientation may be significantly reduced compared to one or more other crystallographic directions. For example, wet etch chemistries based on potassium hydroxide may provide a significantly reduced etch rate with respect to the <111> direction in silicon, which may thus result in corresponding inclined sidewall surfaces 208S of the cavities 208, wherein corresponding angles of the inclined surfaces 208S with respect to a surface normal 201N may be defined by the crystallographic configuration of the base material of the region 202A. For example, the crystallographic configuration of the region 202A may correspond to a standard configuration for silicon-based semiconductor devices in which the surface normal 201N may correspond to a <100> or a physically equivalent direction, while a channel length direction, i.e., the horizontal direction of FIG. 2b, may correspond to a <110> direction. In this case, the surfaces 208S may substantially correspond to the orientation of <111> planes of the silicon crystal, which may have an angle of approximately 36 degrees with respect to the surface normal 201N. Thus, the inclined surfaces 208S may have a common "apex" or edge 208E so that the semiconductor material of the region 202A positioned between the cavities 208 may be considered as a hexagonal region and also the cavities 208 may be referred to as "hexagonal" cavities, although the corresponding sidewalls at the isolation structure 203 may be substantially defined by the insulating material of the structure 203, depending on the corresponding angle of the sidewall portions of the structure 203.

In one illustrative embodiment, the etch process 207A may be performed on the basis of tetra methyl ammonium hydroxide (TMAH), which is a wet chemical agent that may typically be used for etching photoresist material, which, however, may also be used in high concentrations and at elevated temperatures of approximately 50-100° C. to etch silicon material. Furthermore, TMAH may exhibit a high selectivity with respect to silicon dioxide material and also with respect to silicon nitride so that integrity of non-silicon surface areas may be maintained during the etch process 207A, when performed by using TMAH. Also, a respective crystallographically anisotropic etch behavior may be accomplished by using TMAH. Moreover, as previously discussed, in some cases, it may be desirable to "decouple" the vertical etch rate from the lateral etch rate to "drive" the edge 208E further towards the channel region 252, while not significantly further increasing the depth of the cavities 208. In this case, TMAH may be advantageously used in combination with an N-type dopant species incorporated into the semiconductor region 202A at a specified depth, since the etch rate of TMAH may be significantly reduced in N-doped silicon material. Thus, in some illustrative embodiments, a corresponding dopant species, such as arsenic, may be introduced into the region 202A, for instance prior to the etch process 207 and prior to the wet chemical etch process 207A, depending on the overall process strategy.

Figure 2C:
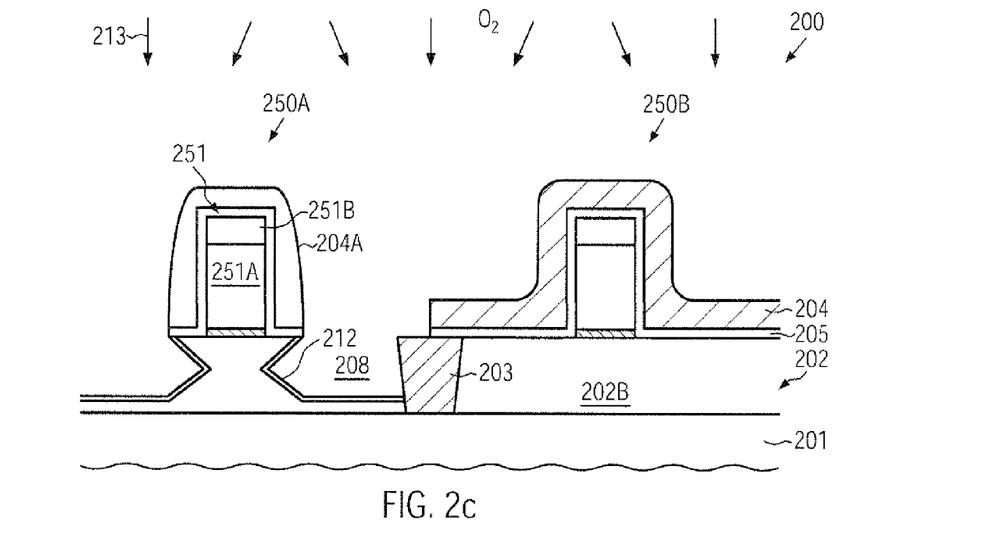
FIG. 2c schematically illustrates the semiconductor device having the non-rectangular cavities during a process for forming a protection layer on exposed surface areas of the cavities, according to further illustrative embodiments.

FIG. 2c schematically illustrates the semiconductor device 200 in a further advanced manufacturing stage in which the protection layer 212 may be formed on at least exposed surfaces of the cavities 208. For example, the protection layer 212 may be comprised of any appropriate material that may be removed in an etch ambient established within a deposition chamber that is used for performing a selective epitaxial growth process. In one illustrative embodiment, the protection layer 212 may be formed on the basis of an oxidizing ambient 213, which may be established on the basis of a gas atmosphere in the furnace and the like, wherein a corresponding temperature may be appropriately selected to avoid any modification of the basic shape of the cavities 208. For example, a furnace process may be performed in an oxidizing ambient at temperatures of approximately 700° C. and less, thereby forming the protection layer 212 on exposed silicon surfaces in a highly controllable manner. The protection layer 212 may be formed with an appropriate thickness to provide sufficient stability during any high temperature treatments in which, typically, silicon material may reflow to a certain degree and which would therefore result in a non-desired loss of the shape of the cavities 208 obtained by the previously performed etch process 207A (FIG. 2b). For example, for a moderately dense silicon dioxide material, a thickness of 2-10 nm may be selected, depending on the overall process and device requirements. Furthermore, by providing the protection layer 212 in the form of a silicon dioxide material obtained by an oxidation process, further silicon material may be "consumed," thereby providing the potential of further reducing the finally obtained offset of the cavities 208 after removal of the protection layer 212 in a further advanced manufacturing stage. It should be appreciated that a corresponding thickness of the protection layer 212 comprised of an oxide material obtained by oxidation may also be taken into consideration when selecting an appropriate depth of the cavities 208 so that, even after removal of the protection layer 212, a corresponding portion of template material may be preserved. In other illustrative embodiments, the protection layer 212 may be provided in the form of an oxidized material by performing a wet chemical oxidation process, for instance using water in combination with ozone, or by using other wet chemical solutions appropriate for oxidizing silicon in a controllable manner.

Figure 2D:
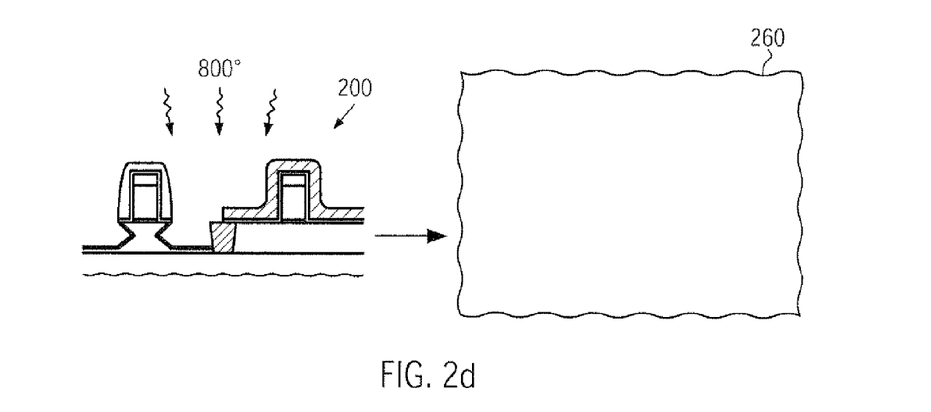
FIGS. 2d-2f schematically illustrate the semiconductor device during various manufacturing stages in preparing the semiconductor device for a subsequent selective epitaxial growth process, wherein the protection layer may provide enhanced integrity of the cavities during elevated temperatures and wherein the protection layer may be removed prior to actually depositing the strain-inducing semiconductor alloy, according to illustrative embodiments.

FIG. 2d schematically illustrates the semiconductor device 200 in a further stage of the manufacturing flow in which the device 200 may be exposed to elevated temperatures, for instance temperatures of approximately 800° C. and higher, as may be required for introducing the device 200 into a process ambient 260, such as a deposition chamber which is appropriate for performing a selective epitaxial growth process and in which also a corresponding reactive ambient may be established to remove the protection layer 212, when a non-critical overall process temperature is achieved.

Figure 2E:
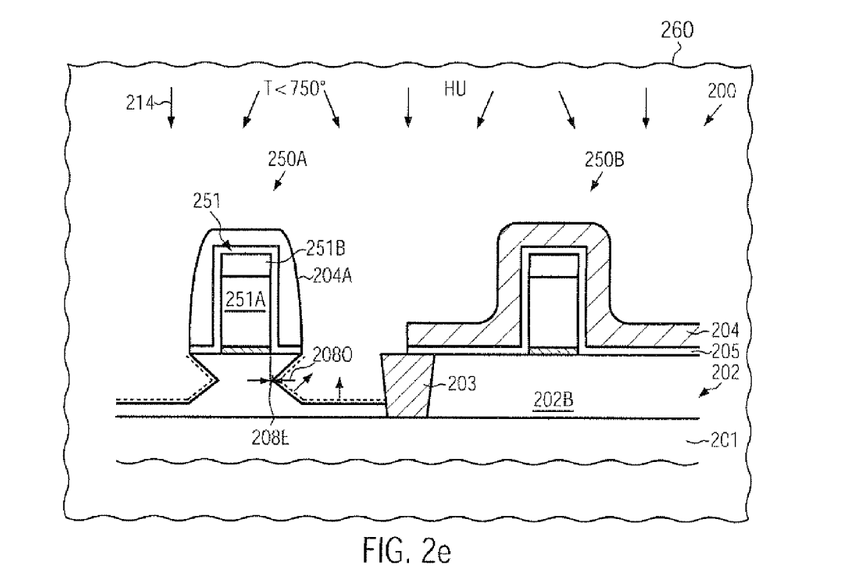

FIG. 2e schematically illustrates the semiconductor device 200 exposed to a reactive ambient 214 established within the process ambient 260 at a temperature at which silicon may remain stable. For example, the reactive ambient 214 may be established on the basis of a temperature of less than approximately 750° C. and may include any appropriate etch chemistry in order to remove the protection layer 212, which has provided integrity of the cavity 208 during the preceding high temperature processes, such as the introduction into the process ambient 260 as shown in FIG. 2d. For example, the ambient 214 may be established on the basis of a chlorine-based etch chemistry when silicon dioxide is to be removed. As previously indicated, during the removal process 214, the final offset 208O of the cavity 208 may further be reduced. For example, for the hexagonal cavity 208 as shown in FIG. 2e, the offset 208O may be defined as the lateral distance of the edge 208E and the gate electrode material 251A, i.e., a corresponding sidewall thereof that is laterally closest to the corresponding cavity. It should be appreciated that the offset 208O may also represent an "overlap" when the edge 208E may extend below the gate electrode material 251A.

In some illustrative embodiments, any further high temperature treatments after removing the protection layer 212 may be omitted, thereby maintaining the shape of the cavities 208 as obtained after removal of the protection layer 212.

Figure 2F:
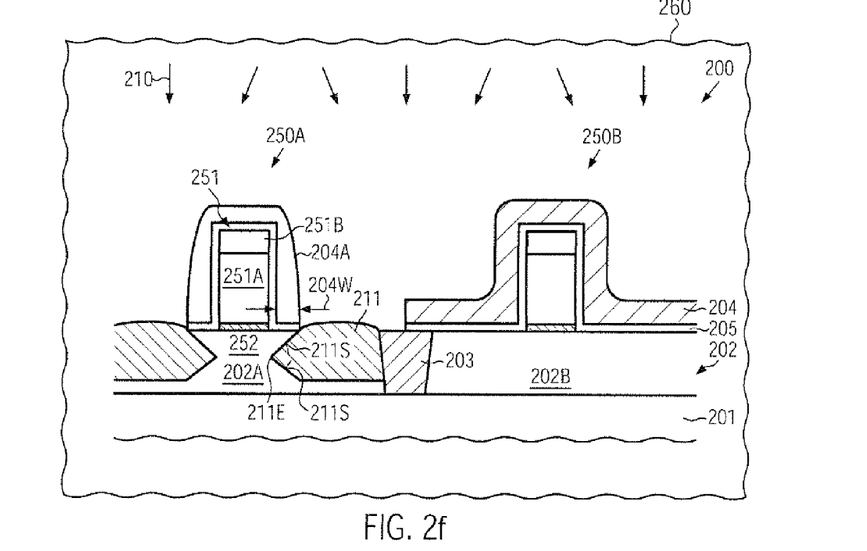

FIG. 2f schematically illustrates the semiconductor device 200 when exposed to a deposition ambient 210 within the process ambient 260. During the process 210, an appropriate semiconductor alloy, such as silicon/germanium, silicon/germanium/tin, silicon/tin, may be deposited at non-critical temperatures with respect to silicon stability, for instance at temperatures of approximately 750° C. and less, by using well-established process parameters. Thus, for the above-specified semiconductor alloys, a corresponding compressive strain may be obtained in the channel region 252 of the transistor 250A, wherein, for a given composition of the semiconductor alloy 211, an increased magnitude may be obtained compared to the conventional strategies, as previously described, due to the specific shape of the cavities 208, as previously described. Thus, the semiconductor alloy 211 may form corresponding interfaces 211S with the remaining silicon material of the region 202A, which may have, at least partially, a reduced offset compared to the width 204W of the spacers 204A. In some illustrative embodiments, the interfaces 211S may represent inclined interfaces, which may merge into a corresponding edge 211E, as also previously explained with reference to the cavities 208 (FIG. 2b), which may thus result in a corresponding "hexagonal" semiconductor alloy 211. Thus, in this case, a well-defined and controllable configuration of the material 211 may be obtained while also a significant enhanced strain may be obtained compared to substantially "rectangular" cavities, as is, for instance, explained above with reference to the conventional device 100.

It should be appreciated that, in other illustrative embodiments, the semiconductor alloy 211 may be provided in the form of a silicon/carbon alloy, which may thus provide a tensile strain component in the channel region 252, when the transistor 250A may represent an N-channel transistor. In other illustrative embodiments, respective cavities may be formed in both transistors 250A, 250B and may be filled with different semiconductor alloys. For example, corresponding cavities may also be formed in the transistor 250B during the preceding manufacturing sequence, while also a corresponding protection layer may cover any surface areas of the corresponding cavities. Furthermore, the shape of these cavities may be maintained on the basis of the corresponding protection layer. Furthermore, during the epitaxial growth process 210 for providing the material 211 in the transistor 250A, the corresponding protection layer may act as a growth mask and may then be selectively removed with respect to the material 211, thereby preparing the device 200 for the deposition of a further semiconductor alloy, such as a silicon/carbon material, if the material 211 is provided as a compressive strain-inducing material.

Figure 2G:
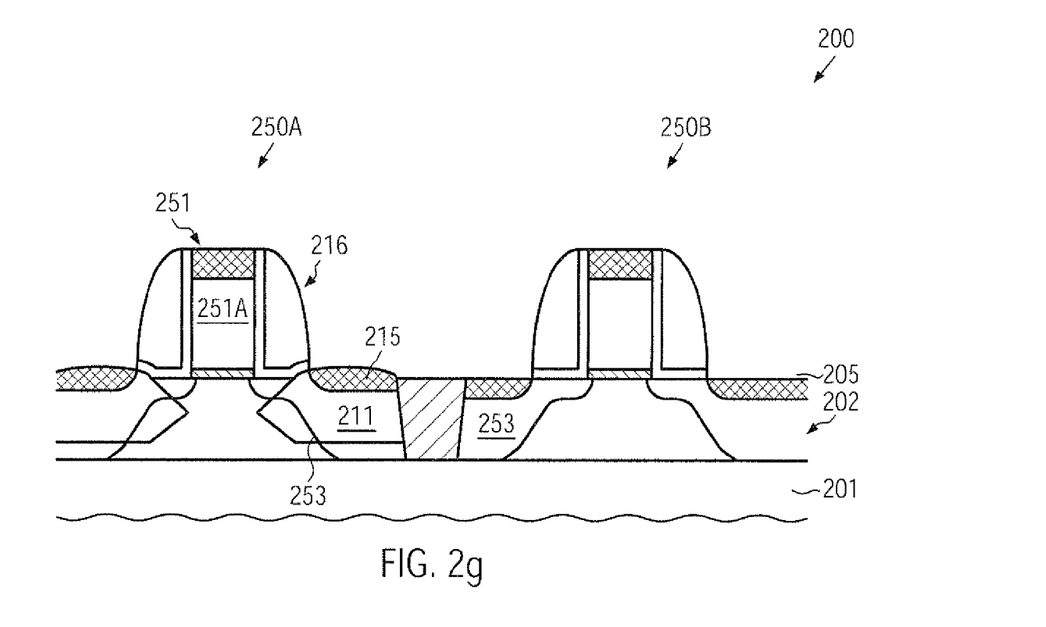
FIG. 2g schematically illustrates the semiconductor device in a very advanced manufacturing stage, according to illustrative embodiments.

FIG. 2g schematically illustrates the semiconductor device 200 in a further advanced manufacturing stage. As illustrated, the transistors 250A, 250B may comprise drain and source regions 253, which may at least partially be formed within the strained semiconductor alloy 211 in the transistor 250A. In the embodiment shown, the transistor 250B may be formed without any strain-inducing semiconductor alloy, while in other cases (not shown) an appropriate semiconductor alloy may also be provided, at least partially, within the drain and source regions 253. Furthermore, a sidewall spacer structure 216 may be formed on sidewalls of the gate electrode structure 251, wherein the spacer structure 216 may have any appropriate configuration as is required for the overall process strategy and the requirements of the transistors 250A, 250B. Furthermore, corresponding metal silicide regions 215 may be formed in the drain and source regions 253 and in the gate electrode material 251A, if required.

The semiconductor device 200 as shown in FIG. 2g may be formed on the basis of the following processes. After providing at least the semiconductor material 211 (FIG. 2f), the spacer 204A and the mask layer 204 may be removed in combination with the liner 205 (see FIG. 2f), and thereafter the spacer structure 216 may be formed, or at least a portion thereof, to act as an implantation mask when at least a portion of the drain and source regions 253 is to be formed on the basis of an ion implantation process. In other cases, at least the drain and source regions 253 may also be formed on the basis of a dopant species that may be incorporated into the material 211 during the deposition. After forming the drain and source regions 253, possibly based on ion implantation techniques for both transistors 250A and transistor 250B, appropriate anneal processes may be performed in order to activate the dopant species and also re-crystallize implantation-induced damage. Next, the metal silicide regions 215 may be formed on the basis of well-established techniques. Subsequently, any further strain-inducing mechanisms may be implemented, for instance in the form of providing a highly stressed dielectric material above at least one of the transistors 250A, 250B, followed by the deposition of an appropriate interlayer dielectric material.

As a result, the present disclosure provides semiconductor devices and techniques in which an increased degree of flexibility in forming a strain-inducing semiconductor alloy may be obtained by appropriately shaping corresponding cavities and maintaining the shape throughout the entire manufacturing sequence. For this purpose, in one illustrative embodiment, the cavities may be formed on the basis of a plasma assisted etch process followed by a wet chemical etch step, which may have a crystallographically anisotropic etch behavior, thereby providing a desired degree of under-etching, the size and shape of which may be highly controllable. Thereafter, a protection layer may be provided to maintain the cavity shape during subsequent high temperature treatments. Thereafter, the strain-inducing semiconductor material may be deposited on the basis of selective epitaxial growth techniques on the basis of non-critical temperature, thereby obtaining a well-defined shape of the semiconductor alloy, which may thus provide enhanced strain in the adjacent channel region, while nevertheless providing gate electrode integrity during the entire process sequence.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming cavities in a silicon-containing crystalline semiconductor region adjacent to a gate electrode structure of a transistor of a semiconductor device, wherein said gate electrode structure comprises an offset sidewall spacer, and said cavities comprise an under-etched region extending under at least said offset sidewall spacer;
    after forming said cavities comprising said under-etched region, forming a protection layer on all exposed surfaces of said cavities;
    introducing said semiconductor device into a process ambient at an elevated first temperature after forming said protection layer;
    adjusting said process ambient so as to have a second lower temperature;
    removing said protection layer in said process ambient; and
    forming a semiconductor alloy in said cavities in said process ambient at said second temperature.

2. The method of claim 1, wherein forming said cavities comprises performing a first etch process comprising a plasma ambient and performing a second etch process comprising a wet etch chemistry.

3. The method of claim 2, wherein said wet etch chemistry has a crystallographically anisotropic removal rate.

4. The method of claim 3, wherein said wet etch chemistry comprises tetra methyl ammonium hydroxide (TMAH).

5. The method of claim 1, wherein forming said protection layer comprises forming an oxide layer on said exposed surfaces of said cavities.

6. The method of claim 5, wherein said oxide layer is formed in an oxidizing gas atmosphere at a temperature of approximately less than 750° C.

7. The method of claim 5, wherein said oxide layer is formed by performing a wet chemical oxidation process.

8. The method of claim 1, further comprising forming drain and source regions at least partially in said semiconductor alloy.

9. The method of claim 1, wherein said semiconductor alloy is formed so as to induce a compressive strain in a channel region of said transistor.

10. The method of claim 9, wherein said semiconductor alloy is comprised of silicon and germanium.

11. The method of claim 1, wherein said first elevated temperature is approximately 800° C. or higher.

12. A method comprising:
    forming cavities in a crystalline semiconductor region laterally offset to a gate electrode structure of a transistor by performing a first etch process comprising a plasma ambient and a second etch process comprising a wet etch chemistry, wherein said cavities comprise an under-etched region extending under at least a sidewall spacer structure of said gate electrode structure;
    forming a protection layer on all exposed surfaces of said cavities;
    introducing said transistor into a process ambient at an elevated temperature after forming said protection layer;
    removing said protection layer in said process ambient;
    forming a strain-inducing semiconductor alloy in said cavities; and
    forming drain and source regions in said semiconductor region.

13. The method of claim 12, further comprising establishing a deposition temperature in said process ambient prior to removing said protection layer.

14. The method of claim 13, wherein said deposition temperature is approximately 750° C. or less.

15. The method of claim 12, wherein said protection layer is formed as a silicon dioxide material.

16. The method of claim 12, wherein said wet etch chemistry of said second etch process has a crystallographically anisotropic etch behavior.

17. The method of claim 12, wherein said semiconductor alloy comprises at least one of germanium and tin.

* * * * *